United States Patent
Sawada

(10) Patent No.: US 8,861,292 B2
(45) Date of Patent: Oct. 14, 2014

(54) SEMICONDUCTOR DEVICE HAVING REDUNDANT WORD LINES AND REDUNDANT BIT LINES

(75) Inventor: Tatsuo Sawada, Tokyo (JP)

(73) Assignee: PSA Luxco S.A.R.L., Luxembourg (LU)

( * ) Notice: Subject to any disclaimer, the term of this patent is extended or adjusted under 35 U.S.C. 154(b) by 238 days.

(21) Appl. No.: 13/594,679

(22) Filed: Aug. 24, 2012

(65) Prior Publication Data

US 2013/0051160 A1 Feb. 28, 2013

(30) Foreign Application Priority Data

Aug. 31, 2011 (JP) .................. 2011-188825

(51) Int. Cl.
| | |
|---|---|
| *G11C 7/00* | (2006.01) |
| *G11C 17/16* | (2006.01) |
| *G11C 11/408* | (2006.01) |
| *G11C 17/18* | (2006.01) |
| *G11C 29/00* | (2006.01) |
| G11C 29/44 | (2006.01) |
| G11C 29/02 | (2006.01) |

(52) U.S. Cl.
CPC ...... *G11C 29/785* (2013.01); *G11C 2029/4402* (2013.01); *G11C 17/16* (2013.01); *G11C 11/4087* (2013.01); *G11C 17/18* (2013.01); *G11C 29/027* (2013.01)
USPC ............. 365/200; 365/230.06; 365/225.7

(58) Field of Classification Search
CPC ........ G11C 29/00; G11C 7/00; G11C 29/848; G11C 29/80; G11C 8/08; G11C 8/10; G11C 29/785; G11C 13/0028; G11C 29/81; G11C 29/027; G11C 29/802

USPC .................. 365/200, 225.7, 230.06, 230.03, 365/189.07, 189.08, 189.03, 194, 189.04
See application file for complete search history.

(56) References Cited

U.S. PATENT DOCUMENTS

| | | | |
|---|---|---|---|
| 6,804,156 B2 | 10/2004 | Ito | |
| 7,254,069 B2 | 8/2007 | Haraguchi et al. | |
| 7,433,251 B2 | 10/2008 | Haraguchi et al. | |
| 8,116,156 B2 | 2/2012 | Riho et al. | |
| 2002/0060934 A1* | 5/2002 | Choi et al. | ............. 365/200 |
| 2004/0022110 A1 | 2/2004 | Haraguchi et al. | |
| 2004/0066684 A1 | 4/2004 | Ito | |
| 2004/0145939 A1* | 7/2004 | Yoshida et al. | ............. 365/145 |
| 2007/0242506 A1 | 10/2007 | Haraguchi et al. | |
| 2008/0175079 A1* | 7/2008 | Jeon et al. | ............. 365/200 |
| 2009/0201752 A1 | 8/2009 | Riho et al. | |

FOREIGN PATENT DOCUMENTS

| | | |
|---|---|---|
| JP | 2004-063023 A | 2/2004 |
| JP | 2004-133970 A | 4/2004 |
| JP | 2009-211796 A | 9/2009 |
| JP | 2010-198694 A | 9/2010 |

* cited by examiner

*Primary Examiner* — Hien Nguyen
(74) *Attorney, Agent, or Firm* — McGinn IP Law Group, PLLC

(57) ABSTRACT

A semiconductor device includes a memory cell array having short and long sides, a row decoder, a row fuse circuit, a column decoder and a column fuse circuit. The row decoder, the row fuse circuit and the column fuse circuit are arranged along the long side of the memory cell array. The column decoder is arranged along the short side of the memory cell array.

18 Claims, 8 Drawing Sheets

SEMICONDUCTOR DEVICE HAVING REDUNDANT WORD LINES AND REDUNDANT BIT LINES

BACKGROUND OF THE INVENTION

1. Field of the Invention

The present invention relates to a semiconductor device, and more particularly relates to a semiconductor device that includes redundant word lines for replacing defective word lines and redundant bit lines for replacing defective bit lines.

2. Description of Related Art

A semiconductor memory device represented by a DRAM (Dynamic Random Access Memory) includes so many memory cells that there is no avoiding including some defective memory cells. Accordingly, redundant word lines and redundant bit lines are prepared in advance in a memory cell array. When a defective memory cell is detected in an operation test, one of the redundant word lines replaces a defective word line corresponding to the defective memory cell or one of the redundant bit lines replaces a defective bit line corresponding to the defective memory cell, thereby repairing the memory device (see Japanese Patent Applications Laid-open Nos. 2010-198694, 2009-211796, 2004-133970, and 2004-63023).

Generally, a row fuse circuit that has addresses of defective word lines stored therein is arranged near a row decoder, and a column fuse circuit that has addresses of defective bit lines stored therein is arranged near a column decoder. This achieves the shortest signal lines that connect the row fuse circuit to the row decoder and those that connect the column fuse circuit to the column decoder. Therefore, it is possible to minimize an access delay.

However, the conventional techniques have the following problems. In the above layout, the row fuse circuit has an extension direction differing by 90° from that of the column fuse circuit, which causes the time required for trimming of fuse elements (address programming by laser irradiation) to be long. Furthermore, because it is impossible to efficiently arrange the fuse elements, the occupation area of the row fuse circuit and the column fuse circuit on a chip increases.

SUMMARY

In one embodiment, there is provided a semiconductor device that includes: a memory cell array that includes a plurality of word lines, a plurality of redundant word lines, a plurality of bit lines and a plurality of redundant bit lines, the memory cell array can be accessed by supplying a row address and a column address; a row fuse circuit that stores addresses of a plurality of defective word lines included in the word lines; a column fuse circuit that stores addresses of a plurality of defective bit lines included in the bit lines; a row decoder that selects one of the word lines based on the row address when the row address does not match the addresses output from the row fuse circuit, and selects one of the redundant word lines when the row address matches one of the addresses output from the row fuse circuit; and a column decoder that selects one of the bit lines based on the column address when the column address does not match the addresses output from the column fuse circuit, and selects one of the redundant bit lines when the column address matches one of the addresses output from the column fuse circuit. The memory cell array has a substantially rectangular shape having short sides in an extension direction of the word lines and the redundant word lines and having long sides in an extension direction of the bit lines and the redundant bit lines. The row decoder, the row fuse circuit and the column fuse circuit are arranged along one of the long sides of the memory cell array, and are laid out in a direction of the short sides of the memory cell array. The column decoder is arranged along one of the short sides of the memory cell array.

In another embodiment, there is provided a semiconductor device that includes: a memory cell array that includes a plurality of word lines, a plurality of bit lines, a plurality of redundant word lines each of which can replace one of the word lines and a plurality of redundant bit lines each of which can replace one of the bit lines, the memory cell array having a first side extending in a first direction and a second side extending in a second direction different from the first direction, the first side having a first length, and the second side having a second length different from the first length; a row fuse circuit that stores one or more addresses of the word lines to be replaced with the redundant word lines, the row fuse circuit having substantially the first length in the first direction; a column fuse circuit that stores one or more addresses of the bit lines to be replaced with the redundant bit lines, the column fuse circuit having substantially the first length in the first direction; a row decoder that selects one of the word lines or one of the redundant word lines based on a row address, the row decoder having substantially the first length in the first direction; and a column decoder that selects one of the bit lines or one of the redundant bit lines based on a column address, the column decoder having substantially the second length in the second direction.

In still another embodiment, there is provided a semiconductor device that includes: a memory cell array that includes a plurality of word lines, a plurality of bit lines, a plurality of redundant word lines each of which can replace one of the word lines and a plurality of redundant bit lines each of which can replace one of the bit lines, the memory cell array having a first side extending in a first direction and a second side extending in a second direction different from the first direction; a first fuse circuit that stores one or more addresses of one of the word lines and the bit lines to be replaced, the first fuse circuit having a first side extending in the first direction and a second side extending in the second direction, the first side of the first fuse circuit is longer than the second side of the first fuse circuit; and a second fuse circuit that stores one or more addresses of the other of the word lines and the bit lines to be replaced, the second fuse circuit having a first side extending in the first direction and a second side extending in the second direction, the first side of the second fuse circuit is longer than the second side of the second fuse circuit.

According to the present invention, it is possible to shorten the time required to trim the fuse elements because the extension direction of the row fuse circuit is the same as that of the column fuse circuit. Furthermore, because the fuse elements can be efficiently arranged, it is possible to reduce the occupation area of the row fuse circuit and the column fuse circuit on a chip. Moreover, because the row decoder and the row fuse circuit are arranged in the short side direction of the memory cell array, it is possible to achieve the shortest lines that connect the row decoder to the row fuse circuit and to minimize the delay during a row access.

DETAILED DESCRIPTION OF THE EMBODIMENTS

Figure 1:
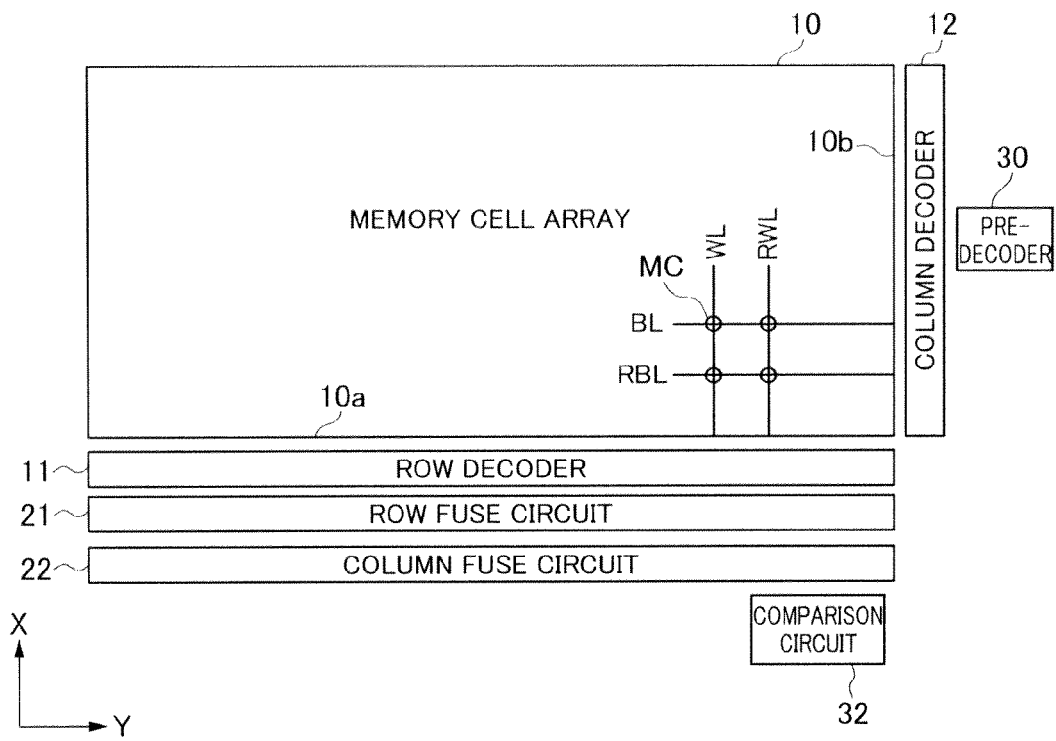
FIG. 1 is a layout diagram indicative of an embodiment of a semiconductor device according to an embodiment of the present invention.

Referring now to FIG. 1, the semiconductor device according to the present embodiment includes a rectangular shaped memory cell array 10 that has short sides in an X direction and long sides in a Y direction. On the side of a long side 10a of the memory cell array 10, a row decoder 11, a row fuse circuit 21, and a column fuse circuit 22 are arranged along the long side 10a. The row decoder 11, the row fuse circuit 21, and the column fuse circuit 22 have shapes a longitudinal direction of which is the Y direction, and are laid out in the X direction. On the side of a short side 10b of the memory cell array 10, a column decoder 12 is arranged along the short side 10b.

The row decoder 11 is a circuit that selects one of a plurality of word lines WL and a plurality of redundant word lines RWL included in the memory cell array 10. As shown in FIG. 1, the word lines WL and the redundant word lines RWL extend in the X direction. The column decoder 12 is a circuit that selects one of a plurality of bit lines BL and a plurality of redundant bit lines RBL included in the memory cell array 10. As shown in FIG. 1, the bit lines BL and the redundant bit lines RBL extend in the Y direction.

Memory cells MC are arranged at intersections between the word lines WL or redundant word lines RWL and the bit lines BL or redundant bit lines BBL, respectively. With this configuration, when a row address and a column address are input in this order, it is possible to access the memory cell MC arranged at the intersection between the word line WL or redundant word line RWL that corresponds to the row address and the bit line BL or redundant bit line RBL that corresponds to the column address.

The row fuse circuit 21 is a circuit that has addresses of a plurality of defective word lines included in the word lines WL stored therein. As described later in detail, the row fuse circuit 21 includes a plurality of fuse elements and latch circuits that latch addresses read from the respective fuse elements. Reading of the addresses from the fuse elements is all executed during a reset operation after the semiconductor device is powered on. Therefore, the reading of the addresses from the fuse elements is performed only once and the latch circuits hold the read addresses until a next reset operation starts.

The column fuse circuit 22 is a circuit that has addresses of a plurality of defective bit lines included in the bit lines BL stored therein. As described later in detail, the column fuse circuit 22 includes a plurality of fuse elements and latch circuits that latch addresses selectively read from the respective fuse elements. Reading of the addresses from the fuse elements is executed in response to a row access. That is, the reading of the addresses from the fuse elements is executed each time the row access is performed, and the previously read addresses are discarded. In this respect, the column fuse circuit 22 greatly differs from the row fuse circuit 21.

Figure 2:
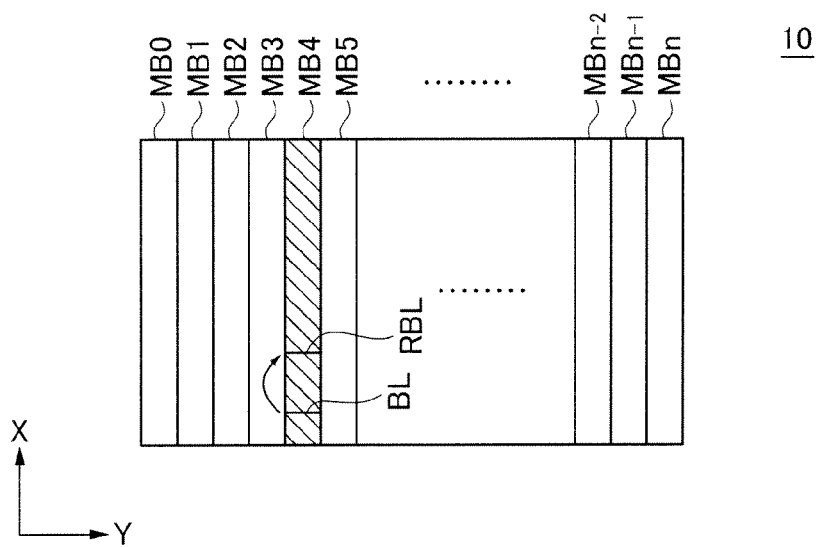
FIG. 2 is a schematic diagram for explaining a memory block in a memory cell array 10 shown in FIG. 1.

The reason that the addresses are read in the column fuse circuit 22 in response to the row access is explained here. Turning to FIG. 2, the memory cell array 10 is structured to array a plurality of (n+1 in FIG. 2) memory blocks MB0 to MBn in the Y direction, and one of the memory blocks MB0 to MBn is selected by the row access. Each of the memory blocks MB0 to MBn shown in FIG. 2 means a range in which one bit line BL or RBL extends. Therefore, for example, when the hatched memory block MB4 is selected by the row access, the bit lines BL that are possibly selected by a subsequent column access are limited to the bit lines BL belonging to the memory block MB4. Therefore, if the bit line BL to be selected by a column access is defective, the redundant bit line RBL belonging to the same memory block MB4 replaces the selected defective bit line BL.

This means that the addresses necessary to read from the column fuse circuit 22 during the column access are limited to those corresponding to the memory block selected by the row access and that it is unnecessary to read the addresses corresponding to the other memory blocks. Therefore, the reading of the addresses from the column fuse circuit 22 is performed in response to the row access.

On the other hand, the row fuse circuit 21 needs to read all the addresses of the defective word lines WL because all the memory blocks MB0 to MBn are possibly selected during the row access. Furthermore, the memory cell array 10 is accessed by the row access followed by the column access. For this reason, it is necessary to read the addresses from the row fuse circuit 21 in advance before the row access is requested. This is why all the addresses are read from the row fuse circuit 21 during the reset operation as described above.

Figure 3:
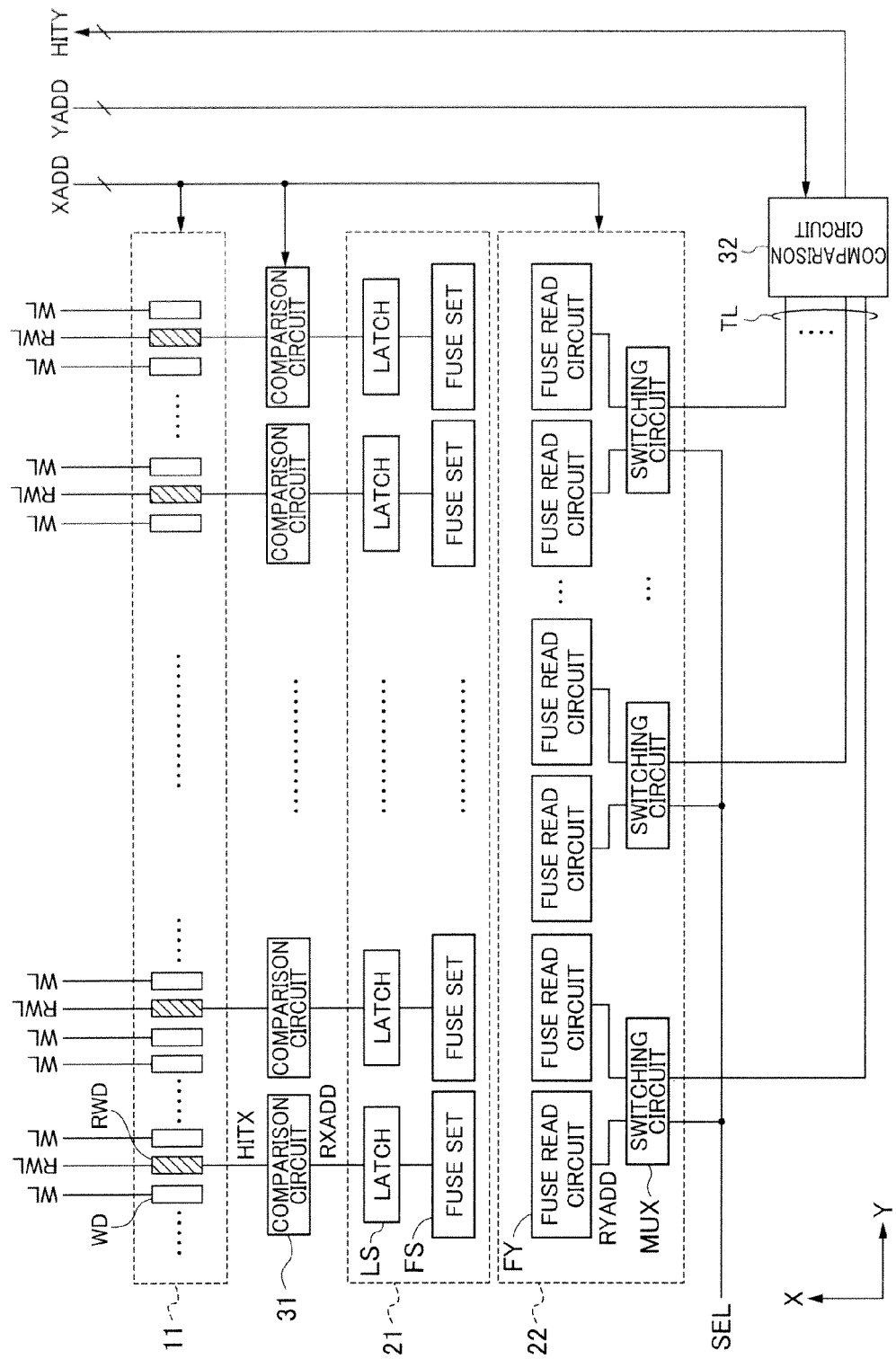
FIG. 3 is a schematic block diagram indicative of an embodiment of configurations of a row decoder 11, a row fuse circuit 21, and a column fuse circuit 22 shown in FIG. 1.
Figure 4:
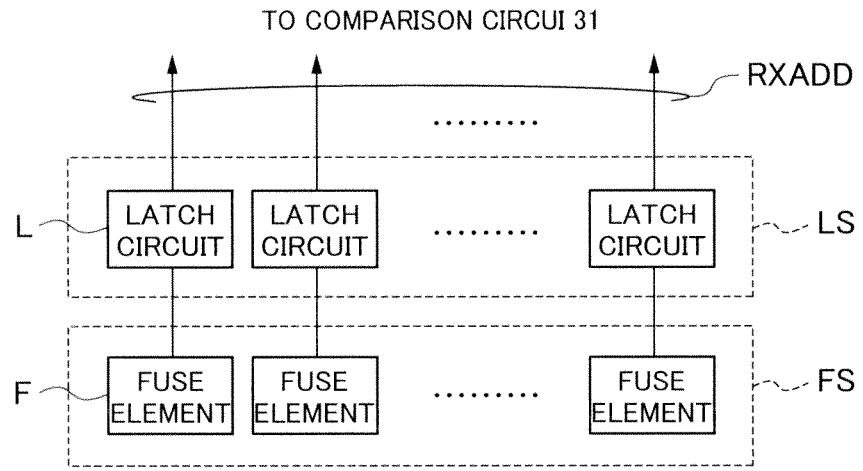
FIG. 4 is a block diagram indicative of an embodiment of configurations of a fuse set FS and a latch circuit set LS shown in FIG. 3.

Turning to FIG. 3, the row fuse circuit 21 includes a plurality of fuse sets FS and a plurality of latch circuit sets LS corresponding to the fuse sets FS, respectively. Each of the fuse sets FS is a circuit that has a row address of one defective word line WL stored therein in a nonvolatile manner. As shown in FIG. 4, each fuse set FS includes fuse elements F corresponding to respective bits of a row address. A row address RXADD stored in the fuse set FS is read when the semiconductor device is reset, and latched by the corresponding latch circuit set LS. Each of the latch circuit sets LS includes a plurality of latch circuits L corresponding to the respective bits of the row address as shown in FIG. 4. The row address RXADD transferred to the latch circuit set LS is supplied to a corresponding comparison circuit 31.

Figure 5:
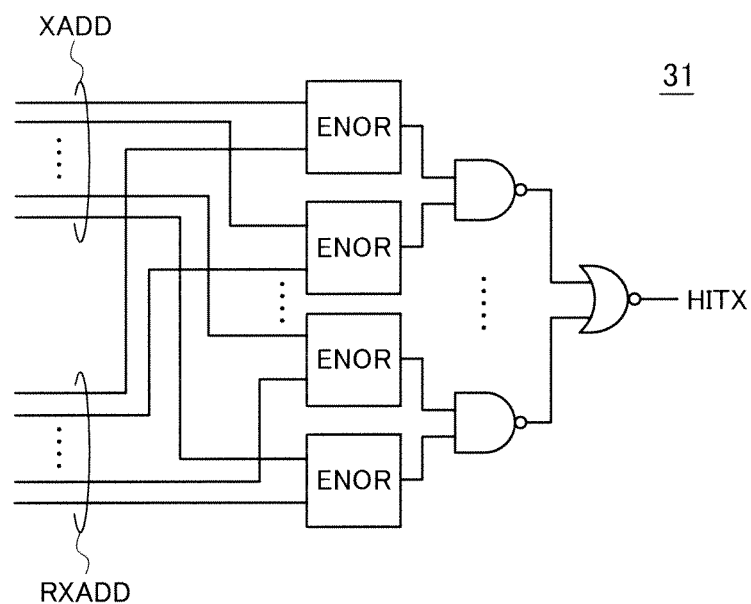
FIG. 5 is a circuit diagram indicative of an embodiment of a comparison circuit 31 shown in FIG. 3.

The comparison circuit 31 is a circuit that compares the row address RXADD supplied from the corresponding latch circuit set LS with a row address XADD to which the access is requested. When the both addresses RXADD and XADD match each other, the comparison circuit 31 activates a hit signal HITX. As an example of a circuit configuration, a circuit that includes exclusive-NOR circuits ENOR that compare the bits of the row address RXADD with the corresponding bits of the row address XADD, respectively, and that activates the hit signal HITX when outputs from these exclusive-NOR circuits ENOR all indicate a high level (that is, matching) can be used as the comparison circuit 31, as shown in FIG. 5.

When the comparison circuit 31 activates the hit signal HITX, a corresponding redundant word driver RWD included in the row decoder 11 selects the redundant word line RWL. On the other hand, when none of the comparison circuits 31 detect matching, a word driver WD corresponding to the row address XADD in the row decoder 11 is activated to thereby select the corresponding word line WL. As shown in FIG. 3, in the present embodiment, the fuse set FS, the latch circuit set LS, the comparison circuit 31, and the redundant word driver RWD corresponding to one another substantially align in the X direction. This achieves the shortest time required since the row address XADD is supplied until the hit signal HITX is generated.

The column fuse circuit 22 includes a plurality of fuse read circuits FY and a plurality of switching circuit MUX. As shown in FIG. 3, one switching circuit MUX is allocated to the two fuse read circuits FY. Each switching circuit MUX outputs a column address RYADD of a defective bit line BL and supplies the column address RYADD to a comparison circuit 32. As shown in FIG. 1, the comparison circuit 32 is arranged on the side of the long side 10a of the memory cell array 10 near the short side 10b.

Figure 6:
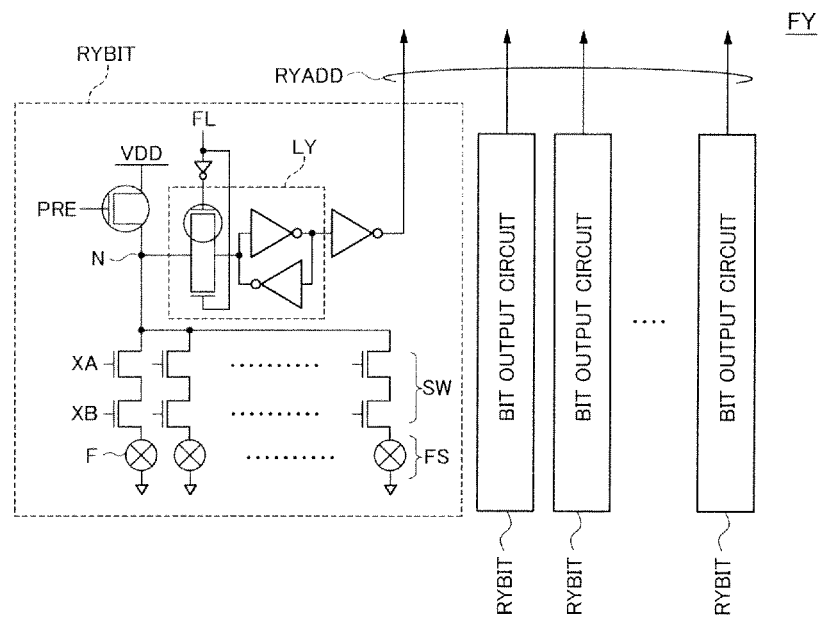
FIG. 6 is a circuit diagram indicative of an embodiment of a fuse read circuit FY shown in FIG. 3.

Turning to FIG. 6, each fuse read circuit FY is configured to include a plurality of bit output circuits RYBIT. The bit output circuits RYBIT are circuits that generate respective bits of the column address RYADD. Each of the bit output circuits RYBIT includes a fuse set FS that includes a plurality of fuse elements F, a switch circuit SW that selects one of these fuse elements F, and a latch circuit LY that latches data stored in the selected fuse element F.

Each of the fuse elements F included in each bit output circuit RYBIT has one bit of the address of the defective bit line BL included in the corresponding memory block stored therein in a nonvolatile manner. The switch circuit SW is configured to provide a plurality of paths each of which includes two transistors connected in series. Signals XA and XB obtained by pre-decoding the row address XADD are supplied to gate electrodes of the transistors of each path, respectively. With this configuration, when the row address XADD is input after a node N is precharged to a VDD level in response to a precharge signal PRE, any one of the paths constituting the switch circuit SW is brought into conduction and then data stored in the selected fuse element F appears on the node N. Specifically, when the fuse element F is in a non-disconnected state (an unprogrammed state), the level of the node N is discharged to a ground level according to the conduction of the corresponding path. Conversely, when the fuse element F is in a disconnected state (a programmed state), the node N keeps the precharge level even if the corresponding path is brought into conduction. By latching the data appearing on the node N to the latch circuit LY using a fuse latch signal FL, the corresponding bit of the column address RYADD is read.

Figure 7:
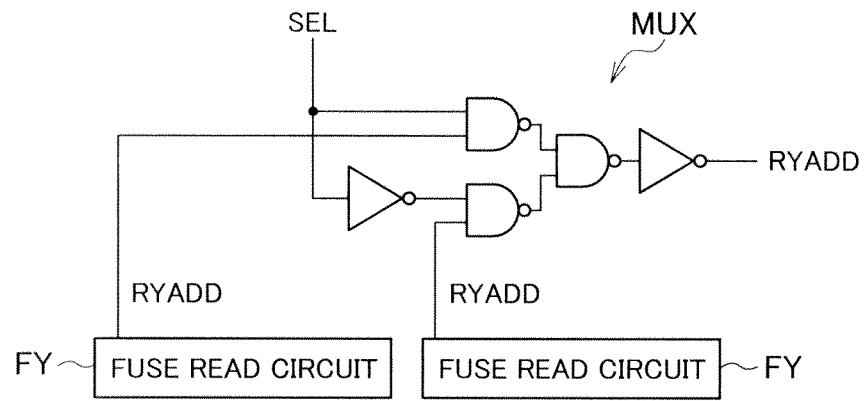
FIG. 7 is a circuit diagram indicative of an embodiment of a switching circuit MUX shown in FIG. 3.

In this way, the column address RYADD corresponding to the row address XADD is read from the fuse read circuit FY each time the row address XADD is supplied. The read column address RYADD is supplied to the switching circuit MUX. As shown in FIG. 7, the switching circuit MUX is a circuit that selects one of the column addresses RYADD read from the two fuse read circuits FY based on a selection signal SEL. Therefore, when the selection signal SEL is at a high level, the switching circuit MUX outputs the column address RYADD read from one of the fuse read circuits FY. When the selection signal SEL is at a low level, the switching circuit MUX outputs the column address RYADD read from the other fuse read circuit FY.

The column addresses RYADD output from the switching circuits MUX are transferred to the comparison circuit 32 via transfer lines TL, respectively. The switching circuit MUX switches over the outputs based on the selection signal SEL, and the column addresses RYADD are therefore transferred in a time division manner via the respective transfer lines TL. The number of bits of column address RYADD multiplied by the number of the switching circuits MUX is the number of the transfer lines TL. Therefore, as compared with a case of transferring the column addresses RYADD read from the fuse read circuit FY at a time to the comparison circuit 32, it is possible to decrease the number of necessary transfer lines TL by half.

Figure 8:
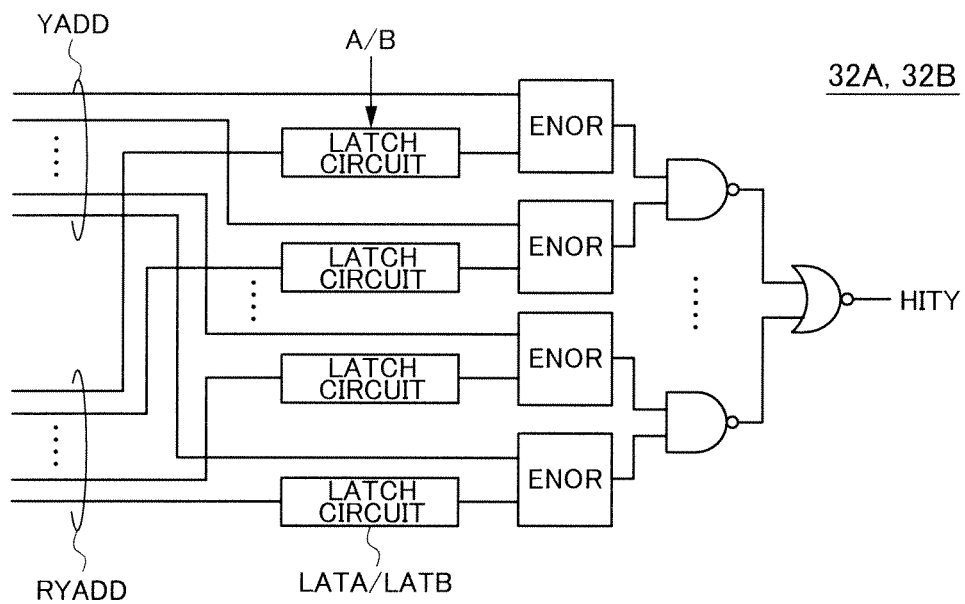
FIG. 8 is a circuit diagram indicative of an embodiment of a comparison circuit 32.

The comparison circuit 32 is a circuit that compares the column addresses RYADD supplied via the transfer lines TL with a column address YADD to which the access is requested (hereinafter, also "access-requested column address YADD"). When the column addresses RYADD matches the column address YADD, the comparison circuit 32 activates a hit signal HITY. As shown in FIG. 8, the comparison circuit 32 is basically identical in circuit configuration to the comparison circuit 31 shown in FIG. 5. However, differently from the comparison circuit 31, the comparison circuit 32 additionally includes latch circuits LATA or LATB that latch the bits of the column address RYADD, respectively, because the column address RYADD are transferred in a time division manner. Specifically, as many comparison circuits 32A each including the latch circuit LATA and as many comparison circuits 32B each including the latch circuit LATB as the switching circuits MUX are provided. Each of the latch circuits LATA is a circuit that performs a latch operation in response to a latch signal A, and each of the latch circuits LATB is a circuit that performs a latch operation in response to a latch signal B.

Therefore, by sequentially activating the latch signals A and B in conjunction with switchover of the selection signal SEL supplied to the switching circuit MUX, the comparison circuits 32A and 32B latch the column addresses RYADD transferred in a time division manner, respectively. When the latched column addresses RYADD are compared with the access-requested column address YADD and the latched column addresses RYADD matches the access-requested column address YADD in all the bits, the comparison circuits 32A and 32B activate the hit signal HITY.

The configuration of the semiconductor device according to the present embodiment is as described above. In this way, according to the present embodiment, it is possible to shorten the time required to trim the fuse elements F included in the row fuse circuit 21 and the column fuse circuit 22 because the row fuse circuit 21 matches the column fuse circuit 22 in the extension direction. Specifically, when the fuse elements F are arrayed in the Y direction in the row fuse circuit 21 and the column fuse circuit 22, the fuse elements F can be trimmed by scanning a laser beam in the Y direction. Furthermore, because the Y direction is the long side direction of the memory cell array 10, it is possible to sufficiently secure lengths of the row fuse circuit 21 and the column fuse circuit 22 in the Y direction and to attain high trimming efficiency. Moreover, because the fuse elements F are arranged efficiently along the long side 10a of the memory cell array 10, it is also possible to reduce the occupation area of the row fuse circuit 21 and the column fuse circuit 22 on a chip.

Furthermore, because of the arrangement of the row decoder 11 and the row fuse circuit 21 in the X direction, the shortest lines that connect the row decoder 11 to the row fuse circuit 21 can be achieved and a delay during the row access can be minimized. While the distance between the column decoder 12 and the column fuse circuit 22 is somewhat large, it is possible to reduce the length of lines that connect a column address pre-decoder 30 to the comparison circuit 32 by laying out the comparison circuit 32 at the position shown in FIG. 1. The pre-decoder 30 is a circuit that generates a pre-decode signal by partially decoding the access-requested column address YADD and that supplies the pre-decode signal to the column decoder 12 and the comparison circuit 32.

Because the column addresses RYADD are transferred from the column fuse circuit 22 to the comparison circuit 32 in a time division manner, the number of the transfer lines TL used to transfer the column addresses RYADD can be decreased by half.

Figure 9:
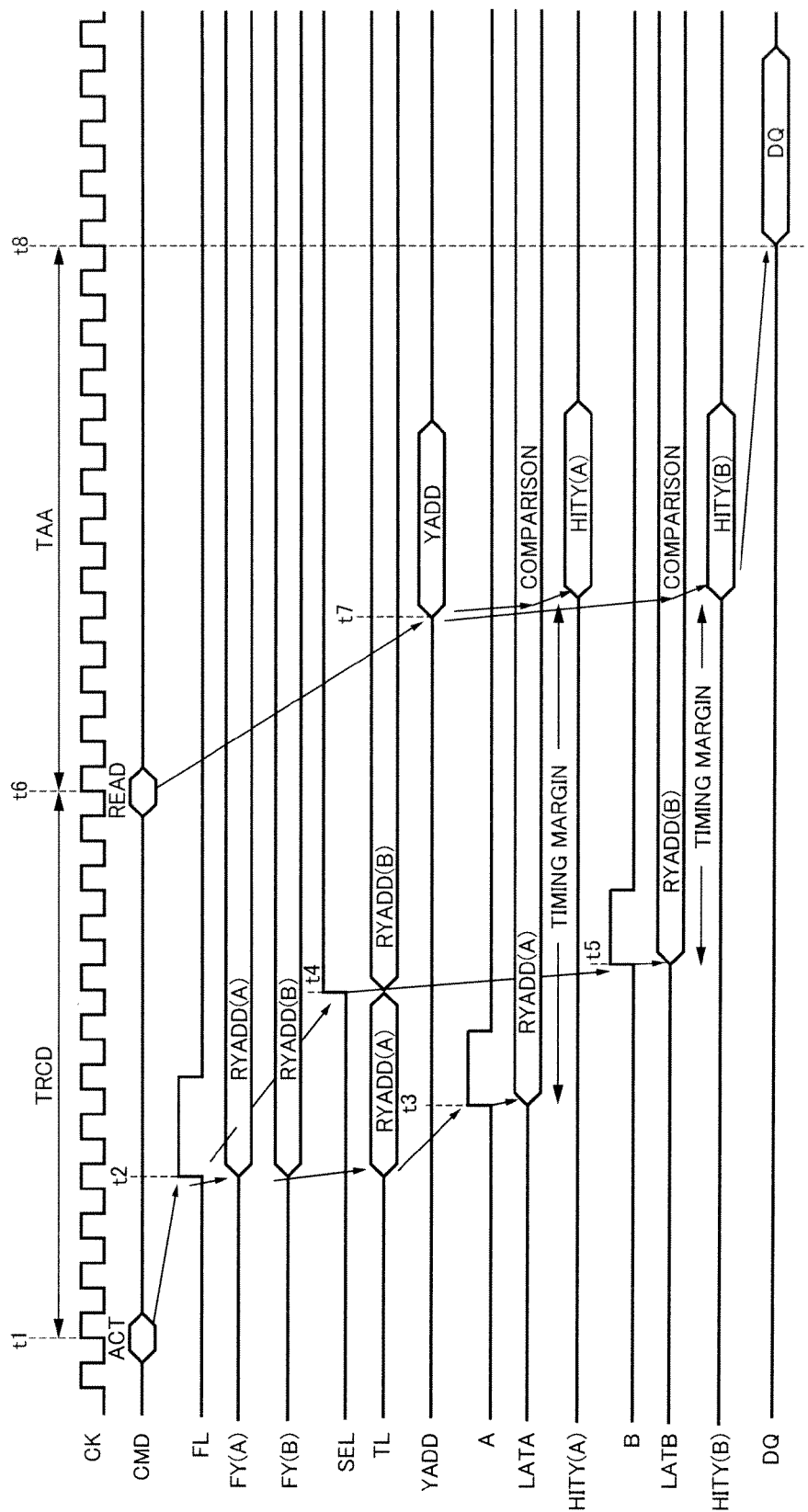
FIG. 9 is a timing diagram for explaining an operation performed by the semiconductor device according to the present embodiment.

Turning to FIG. 9, in an example shown in FIG. 9, an active command ACT is issued at a time t1 and a read command READ is issued at a time t6. The active command ACT is issued from a memory controller (not shown) when a row access is performed, and the row address XADD is supplied synchronously with the active command ACT. The read command READ is issued from the memory controller when a read operation is performed in response to a column access, and the column address YADD is supplied synchronously with the read command READ.

When the row address XADD is input synchronously with the active command ACT, the comparison circuit 31 compares the input row address XADD with the row addresses RXADD read from the row fuse circuit 21. As a result, when the input row address XADD does not match any of the row addresses RXADD read from the row fuse circuit 21, the row decoder 11 selects one of the word lines WL based on the input row address XADD. On the other hand, when the input row address XADD matches one of the row addresses RXADD read from the row fuse circuit 21, the row decoder 11 selects one of the redundant word lines RWL based on the row address RXADD for which the corresponding comparison circuit 31 activates the hit signal HITX.

While such a row access is being performed, the column fuse circuit 22 executes reading out the column addresses RYADD. As described above, the column addresses RYADD that are stored in and to be read from the column fuse circuit 22 is selected in response to the supplied row address XADD. When the column addresses RYADD are read, the fuse latch signal FL is activated at a time t2, the latch circuits LY included in the bit output circuits RYBIT latch the respective bits of the column addresses RYADD. The column addresses RYADD are thereby output from the fuse read circuits FY, respectively. In FIG. 9, FY(A) denotes one of the two fuse read circuits FY that share one transfer line TL and FY(B) denotes the other fuse read circuit FY, and RYADD(A) and RYADD(B) denote the column addresses RYADD read from these fuse read circuits FY(A) and FY(B), respectively.

When the column addresses RYADD(A) and RYADD(B) are read from the fuse read circuits FY(A) and FY(B), respectively, these are supplied to the corresponding switching circuit MUX. At the time t2, the selection signal SEL input to the switching circuit MUX is at a low level, and the switching circuit MUX selects one column address RYADD(A) based on the low-level selection signal SEL. The selected column address RYADD(A) is supplied to the comparison circuit 32 via the transfer line TL. When the latch signal A is activated at a time t3, the latch circuits LATA included in the comparison circuit 32 load the column address RYADD(A).

Next, at a time t4, the selection signal SEL changes to a high level, and the switching circuit MUX selects the other column address RYADD(B) based on the high-level selection signal SEL. The selected column address RYADD(B) is supplied to the comparison circuit 32 via the transfer line TL. When the latch signal B is activated at a time t5, the latch circuits LATB included in the comparison circuit 32 load the column address RYADD(B).

Subsequently, when the column address YADD as well as the read command READ is input at a time t6, the pre-decoded column address YADD is supplied from the pre-decoder 30 to the comparison circuit 32 at a time t7. The comparison circuit 32 compares the supplied column address YADD with the loaded column addresses RYADD(A) and RYADD(B). When the column address YADD matches one of the column addresses RYADD(A) and RYADD(B), the comparison circuit 32 activates the hit signal HITY. When the comparison circuit 32 does not activate the hit signal HITY, that is, the input column address YADD does not match any of the column addresses RYADD (A) and RYADD(B) read from the column fuse circuit 22, the column decoder 12 selects one of the bit lines BL based on the input column address YADD. On the other hand, when the comparison circuit 32 activates the hit signal HITY, that is, the input column address YADD matches one of the column addresses RYADD(A) and RYADD(B) read from the column fuse circuit 22, the column decoder 12 selects one of the redundant bit lines RBL based on the matched column address RYADD for which the comparison circuit 32 activates the hit signal HITY.

When the column access is completed as described above, read data DQ is read from the memory cell array 10 and output to outside at a time t8.

In this way, the column addresses RYADD are transferred twice separately in a time division manner according to the present embodiment. There is a certain amount of time since the active command ACT is issued (the time t1) until the column address YADD is supplied to the comparison circuit 32 (the time t7). Accordingly, the transfer of the column addresses RYADD in a time division manner prevents a time interval TRCD since the active command ACT is issued until the read command READ is issued from increasing and a time interval TAA since the read command READ is issued until the read data DQ is output from increasing. That is, no access delay occurs.

Figure 10:
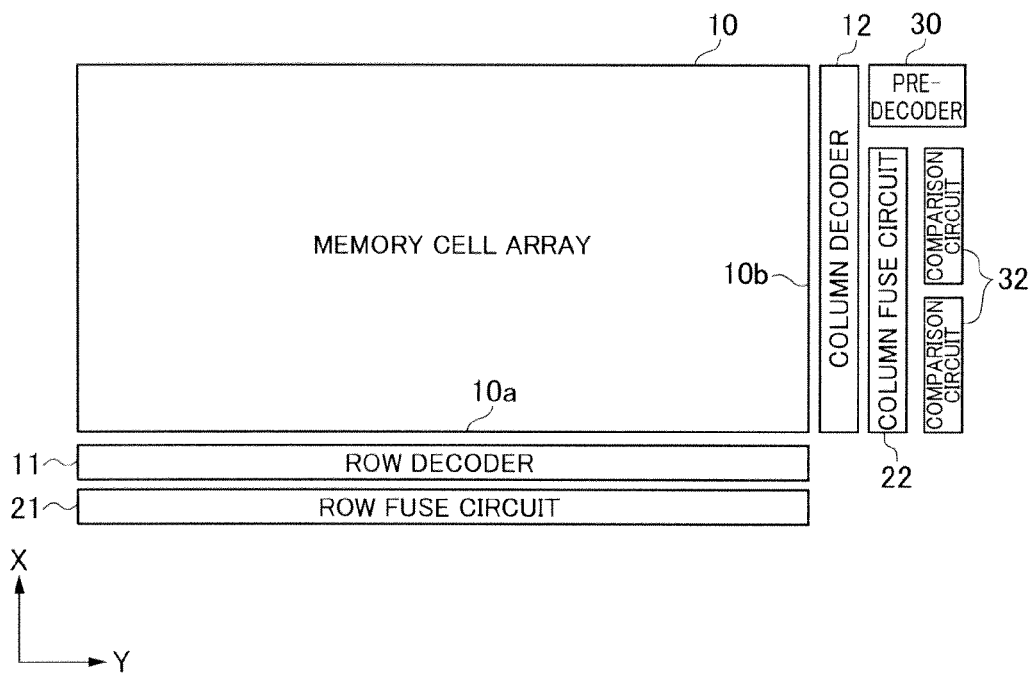
FIG. 10 is a layout diagram of a semiconductor device that the inventor has conceived as a first prototype in the course of making the present invention.

In the first prototype in the course of making the present invention shown in FIG. 10, the row decoder 11 and the row fuse circuit 21 are arranged along the long side 10a of the memory cell array 10, and the column decoder 12 and the column fuse circuit 22 are arranged along the short side 10b of the memory cell array 10. The comparison circuits 32 are also arranged along the short side 10b of the memory cell array 10. According to this layout, shortest column-side paths are achieved but a column access is unable to start at all until a row access is completed, which does not possibly contribute to access speed-up. Rather, it takes a longer time for trimming because the longitudinal direction (the Y direction) of the row fuse circuit 21 differs by 90° from the longitudinal direction (the X direction) of the column fuse circuit 22. Furthermore, it is difficult to reduce the occupation area on the chip because of dispersion of positions of the fuse elements F.

Figure 11:
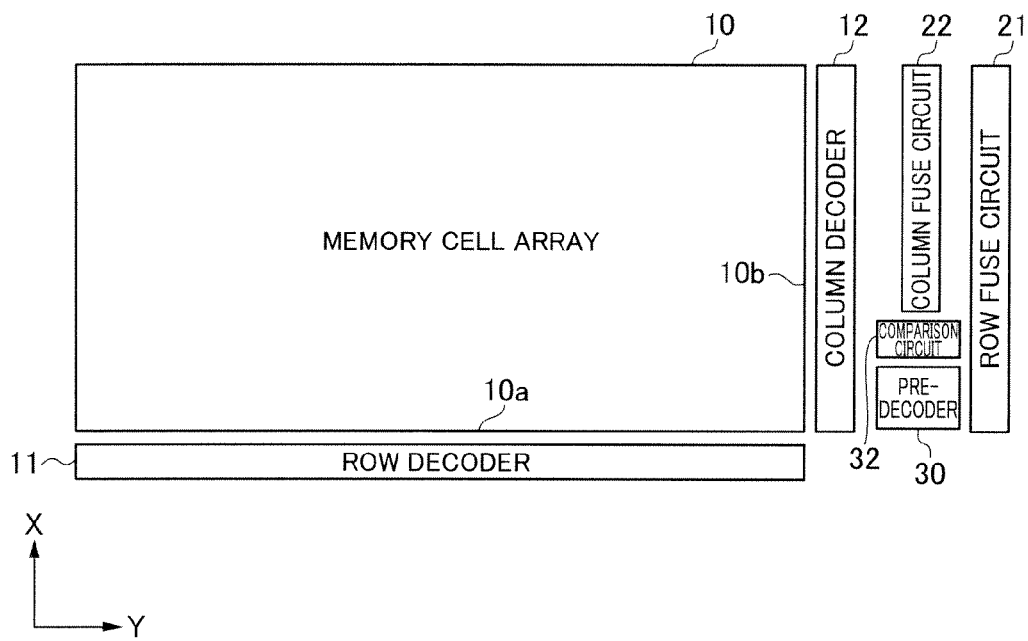
FIG. 11 is a layout diagram of a semiconductor device that the inventor has conceived as a second prototype in the course of making the present invention.

In the second prototype in the course of making the present invention shown in FIG. 11, the row decoder 11 is arranged along the long side 10a of the memory cell array 10, and the column decoder 12, the row fuse circuit 21, and the column fuse circuit 22 are arranged along the short side 10b of the memory cell array 10. The comparison circuit 32 is also arranged along the short side 10b of the memory cell array 10.

According to this layout, the problems that occur in the layout shown in FIG. 10 are solved because the row fuse circuit 21 matches the column fuse circuit 22 in the longitudinal direction (the X direction). However, the distance from the row fuse circuit 21 to the row decoder 11 increases. Accordingly, the time required for the row access increases and it is necessary to design the time interval TRCD to be long. Furthermore, the occupation area of the row fuse circuit 21 and the column fuse circuit 22 on the chip cannot be sufficiently reduced because the row fuse circuit 21 and the column fuse circuit 22 are arranged along the short side 10b of the memory cell array 10 while the positions of the fuse elements F are concentrated.

Figure 12:
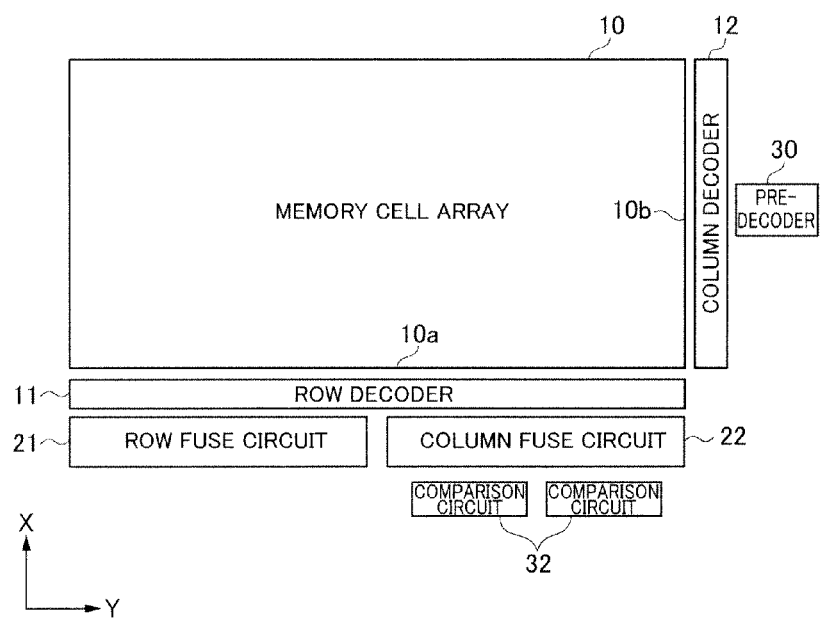
FIG. 12 is a layout diagram of a semiconductor device that the inventor has conceived as a third prototype in the course of making the present invention.

In the third prototype in the course of making the present invention shown in FIG. 12, the row decoder 11, the row fuse circuit 21, and the column fuse circuit 22 are arranged along the long side 10a of the memory cell array 10, and the column decoder 12 is arranged along the short side 10b of the memory cell array 10. Differently from the present embodiment, the row fuse circuit 21 and the column fuse circuit 22 are laid out in the longitudinal direction (they direction). In this layout, it is impossible that Y-coordinates of the fuse sets FS and the latch circuit sets LS included in the row fuse circuit 21 match those of the redundant word drivers RWD included in the row decoder 11, and it is necessary to connect the fuse sets FS and the latch circuit sets LS to the corresponding redundant word drivers RWD by leading the lines in the Y direction. Accordingly, the time required for the row access increases although the time is shorter than that according to the layout shown in FIG. 11.

In contrast to these prototypes, the semiconductor device according to the present embodiment does not cause these problems but can realize high-speed accesses while attaining the shortened trimming time and the reduced occupation area of the fuse elements F.

It is apparent that the present invention is not limited to the above embodiments, but may be modified and changed without departing from the scope and spirit of the invention.

For example, while the column addresses RYADD read from the column fuse circuit 22 are transferred in a time division manner in the above embodiment, this transfer method is not essential to the present invention. Furthermore, even when the time-division transfer is performed, three or more column addresses RYADD can be transferred in a time division manner.

What is claimed:

1. A semiconductor device comprising:
a memory cell array that includes a plurality of word lines, a plurality of redundant word lines, a plurality of bit lines and a plurality of redundant bit lines, the memory cell array can be accessed by supplying a row address and a column address;
a row fuse circuit that stores addresses of a plurality of defective word lines included in the word lines;
a column fuse circuit that stores addresses of a plurality of defective bit lines included in the bit lines;
a row decoder that selects one of the word lines based on the row address when the row address does not match the addresses output from the row fuse circuit, and selects one of the redundant word lines when the row address matches one of the addresses output from the row fuse circuit; and
a column decoder that selects one of the bit lines based on the column address when the column address does not match the addresses output from the column fuse circuit, and selects one of the redundant bit lines when the column address matches one of the addresses output from the column fuse circuit, wherein
the memory cell array has a substantially rectangular shape having short sides in an extension direction of the word lines and the redundant word lines and having long sides in an extension direction of the bit lines and the redundant bit lines,
the row decoder, the row fuse circuit and the column fuse circuit are arranged along one of the long sides of the memory cell array, and are laid out in a direction of the short sides of the memory cell array, and
the column decoder is arranged along one of the short sides of the memory cell array.

2. The semiconductor device as claimed in claim 1, wherein the column fuse circuit selectively outputs one or more of the addresses stored therein based on the row address.

3. The semiconductor device as claimed in claim 2, wherein the row fuse circuit outputs all the addresses stored therein.

4. The semiconductor device as claimed in claim 1, further comprising a comparison circuit that compares the addresses output from the column fuse circuit with the column address, wherein the column fuse circuit includes a switching circuit that sequentially outputs two or more addresses stored therein to the comparison circuit.

5. The semiconductor device as claimed in claim 4, wherein the comparison circuit is arranged along the long side of the memory cell array at near the short side of the memory cell array on which the column decoder is arranged.

6. The semiconductor device as claimed in claim 1, wherein the row decoder, the row fuse circuit and the column fuse circuit are arranged in the direction of the short sides of the memory cell array in this order viewed from the one of the long sides of the memory cell array.

7. A semiconductor device comprising:
a memory cell array that includes a plurality of word lines, a plurality of bit lines, a plurality of redundant word lines each of which can replace one of the word lines and a plurality of redundant bit lines each of which can replace one of the bit lines, the memory cell array having a first side extending in a first direction and a second side extending in a second direction different from the first direction, the first side having a first length, and the second side having a second length different from the first length;
a row fuse circuit that stores one or more addresses of the word lines to be replaced with the redundant word lines, the row fuse circuit having substantially the first length in the first direction;
a column fuse circuit that stores one or more addresses of the bit lines to be replaced with the redundant bit lines, the column fuse circuit having substantially the first length in the first direction;
a row decoder that selects one of the word lines or one of the redundant word lines based on a row address, the row decoder having substantially the first length in the first direction; and
a column decoder that selects one of the bit lines or one of the redundant bit lines based on a column address, the column decoder having substantially the second length in the second direction.

8. The semiconductor device as claimed in claim 7, wherein the row decoder, the row fuse circuit and the column fuse circuit are arranged in the second direction in this order viewed from the first side of the memory cell array.

9. The semiconductor device as claimed in claim 8, further comprising a comparison circuit that compares the addresses output from the column fuse circuit with the column address.

10. The semiconductor device as claimed in claim 9, wherein the row decoder, the row fuse circuit and the column fuse circuit are arranged between the memory cell array and the comparison circuit.

11. The semiconductor device as claimed in claim 10, wherein the comparison circuit is arranged near the second side of the memory cell array.

12. The semiconductor device as claimed in claim 11, wherein the column decoder is arranged along the second side of the memory cell array.

13. The semiconductor device as claimed in claim 12, wherein the word line and the redundant word lines extend in the second direction, and the bit line and the redundant bit lines extend in the first direction.

14. A semiconductor device comprising:
a memory cell array that includes a plurality of word lines, a plurality of bit lines, a plurality of redundant word lines each of which can replace one of the word lines and a plurality of redundant bit lines each of which can replace one of the bit lines, the memory cell array having a first side extending in a first direction and a second side extending in a second direction different from the first direction;
a first fuse circuit that stores one or more addresses of one of the word lines and the bit lines to be replaced, the first fuse circuit having a first side extending in the first direction and a second side extending in the second direction, the first side of the first fuse circuit is longer than the second side of the first fuse circuit; and
a second fuse circuit that stores one or more addresses of the other of the word lines and the bit lines to be replaced, the second fuse circuit having a first side extending in the first direction and a second side extending in the second direction, the first side of the second fuse circuit is longer than the second side of the second fuse circuit.

15. The semiconductor device according to claim 14, wherein the first side of the memory cell array is longer than the second side of the memory cell array.

16. The semiconductor device according to claim 14, wherein the memory cell array, the first fuse circuit and the second fuse circuit are arranged in the second direction.

17. The semiconductor device according to claim 14, further comprising a first decoder that selects one of the word lines or one of the redundant word lines based on a row address, the first decoder having a first side extending in the first direction and a second side extending in the second side, the first side of the first decoder is longer than the second side of the first decoder.

18. The semiconductor device according to claim 17, wherein the first decoder is allocated between the first side of the memory cell array and the first side of the first fuse circuit.

* * * * *